United States Patent [19]

Andrews, Jr. et al.

[11] Patent Number: 4,978,915
[45] Date of Patent: Dec. 18, 1990

[54] METHOD OF MANUFACTURING SEMICONDUCTOR DEVICES INVOLVING THE DETECTION OF IMPURITIES

[75] Inventors: John M. Andrews, Jr., Watchung; Nadia Lifshitz, Bridgewater; Gerald Smolinsky, Madison, all of N.J.

[73] Assignee: AT&T Bell Laboratories, Murray Hill, N.J.

[21] Appl. No.: 432,947

[22] Filed: Nov. 7, 1989

[51] Int. Cl.⁵ .................. G01R 27/26; G01R 31/26
[52] U.S. Cl. .................... 324/158 R; 324/73.1; 324/158 D; 437/8
[58] Field of Search ............ 324/158 R, 158 D, 71.5, 324/658, 678, 158 T; 437/8

[56] References Cited

U.S. PATENT DOCUMENTS

| | | | |
|---|---|---|---|
| 3,995,216 | 11/1976 | Yun | 324/158 R |
| 4,282,483 | 8/1981 | Kren et al. | 324/158 R |
| 4,319,187 | 3/1982 | Crandall | 324/158 D |
| 4,323,842 | 4/1982 | McGarrity et al. | 324/158 R |
| 4,325,025 | 4/1982 | Corcoran et al. | 324/158 R |
| 4,611,385 | 9/1986 | Forrest et al. | 324/71 |
| 4,661,771 | 4/1987 | Nakamura | 324/158 D |
| 4,758,786 | 7/1988 | Hafeman | 324/158 D |

OTHER PUBLICATIONS

Kuhn, M. et al., "Ionic Contamination and Transport of Mobile Ions in MOS Structure," *J. Electrochem. Soc.*, vol. 118, p. 966 (1971).

Chou, N. J., "Application of Triangular Voltage Sweep Method to Mobile-Charge Studies in MOS Structures," *J. Electrochem. Soc.*, vol. 118, p. 603 (1971).

Lifshitz, N. et al., "Detection of Water-Related Charge in Electronic Dielectrics," *Appl. Phys. Lett.*, vol. 55, No. 4, Jul. 24, 1989, pp. 408–410.

Lifshitz, N. et al., "Water-Related Charge Motion in Dielectrics," *J. Electrochem. Soc.*, vol. 136, No. 8, Aug., 1989, pp. 2335–2340.

Lifshitz, N. et al., "Mobile Charge in a Novel Spin-On Oxide (SOX): Detection of Hydrogen in Dielectrics," *J. Electrochem. Soc.*, vol. 136, No. 5, May 1989, pp. 1440–1446.

Primary Examiner—Reinhard J. Eisenzopf
Assistant Examiner—Vinh P. Nguyen
Attorney, Agent, or Firm—Eugen E. Pacher; Peter V. D. Wilde

[57] ABSTRACT

The TVS method is a voltammetric method for detecting mobile ionic impurities in the dielectric layer of a MOS capacitor structure. Disclosed here is a method of semiconductor device fabrication involving a modified TVS method in which the voltage is changed in discrete steps rather than varied continuously, and charge, rather than induced current, is measured. The modified TVS method can be faster than conventional TVS, and calibration is unnecessary.

7 Claims, 2 Drawing Sheets

METHOD OF MANUFACTURING SEMICONDUCTOR DEVICES INVOLVING THE DETECTION OF IMPURITIES

BACKGROUND OF THE INVENTION

This invention relates to methods of manufacturing semiconductor electronic devices, such as MOS integrated circuits (ICs), incorporating layers of dielectric material and also incorporating at least one layer of metal.

The oxide layer of an MOS structure must be of relatively high purity. Mobile ions, for example sodium ions, are known to occur in silicon dioxide layers formed by conventional methods. These ions are detrimental to the performance of MOS devices. In silicon field-effect transitors, for example, mobile ions in the gate oxide layer cause shifts in the operating voltage of the device. One conventional, non-destructive method that has been developed for measuring the mobile-ion concenttration is silicon dioxide layers is the Triangular-Voltage-Sweep (TVS) method.

Typically, the TVS method is applied to selected test portions of a wafer to be processed. Each of the test portions is configured as an MOS capacitor, having a silicon substrate, a dielectric layer, typically of silicon dioxide, in contact with the substrate, and a metal contact, typically an aluminum contact, formed in contact with the dielectric layer on the side opposite to the substrate. Significantly, two interfaces are defined by these three layers: an interface between the silicon substrate and the dielectric layer, and a second interface between the dielectric layer and the metal contact.

The TVS method is described, for example, in M. Kuhn and D. J. Silversmith, "Ionic Contamination and Transport of Mobile Ions in MOS Structures," *J. Electrochem. Soc.*, Vol. 118, Pg. 966 (1971), and in N. J. Chou, "Application of Triangular Voltage Sweep Method to Mobile Charge Studies in MOS Structures," *J. Electrochem. Soc.*, Vol. 118, Pg. 603 (1971). Briefly, during testing of an MOS capacitor, the capacitor is maintained at an elevated temperature, typically 100°-400° C., while a triangular voltage sweep is applied across the capacitor. That is, the applied voltage is varied continuously and linearly with time from a negative extreme of, e.g., −10 V to an equal but opposite positive extreme of, e.g., 10 V, and then returned to the initial voltage in the same manner. (The positive and negative voltage extremes must be sufficient to produce an average electric field of approximately 1 MV/cm in the dielectric layer being tested. Thus the actual voltages required are determined by the thickness of the dielectric layer.) The sweep rate is relatively slow, typically about 5-100 mV per second. (For present purposes, the applied voltage if negative is the silicon substrate is negative relative to the dielectric layer.) As the applied voltage is varied, the displacement current (i.e., the time rate of change of the charge induced at the silicon-dielectric interface by the applied voltage) is continuously monitored. The displacement current has, in addition to an electronic component, a component due to the motion of mobile ionic impurites, for example, sodium ions. A graph, here called a characteristic curve, is readily constructed in which the vertical axis represents the displacement current and the horizontal axis represents the sweep voltage (or sweep time, which is typically proportional to the sweep voltage). In many dielectrics, the ionic component due to alkali-metal ions appears in the characteristic curve as a well-defined peak appearing near mid-sweep, i.e., near zero applied volts. The area under the peak is proportional to the concentration of mobile ionic impurities.

Additionally, if defects or a conduction path are present in the dielectric, a leakage current may appear. The presence of a leakage current causes the characteristic curve to have a non-zero slope. However, this effect is readily prevented by growing a blocking layer of a highly insulating dielectric, such as thermally grown silicon dioxide, between the silicon substrate and the dielectric layer to be tested.

From the characteristic curve, it is possible to infer quantitative information about the mobile-ionic-charge distribution. However, such inferences are drawn under two assumptions. The first assumption is that the total number of ions is constant during the voltage sweep. The second assumption is that the ionic-charge distribution is in quasi-static equilibrium; that is, the assumption that at every moment, the ionic-charge distribution is in equilibrium with the instantaneous value of the applied voltage, in conformance with Poisson's equation.

If quasi-static equilibrium applies, then the ionic component, $I_{ionic}$, of the displacement current is expressed by $$I_{ionic}(V) = \pm \alpha \frac{d}{dV} \int_0^{x_0} \frac{x}{x_0} \rho(x,V) dx,$$

where $x_0$ is the thickness of the dielectric, $\alpha$ is the (linear) sweep rate, $\rho$ is the ionic-charge distribution, and the integral represents a weighted average areal-charge density. In that case, the area under the TVS peak is equal to $\alpha$ times the difference between the weighted averages at the respective endpoints of the voltage sweep. In particular, if essentially all of the mobile charge is acumulated at one interface by applying a constant voltage of at least the peak sweep amplitude to the sample prior to the sweep, the area of the resulting peak will be proportional to the total areal-charge density due to mobile ions.

However, the assumption of quasi-static equilibrium will only apply if the applied voltage is varied relatively slowly. Kuhn and Silversmith, for example, estimate that at temperatures above 150° C., equilibrium may be expected to apply at sweep rates less than 100 mV/sec. As a consequence, the conventional TVS method is useful for obtaining quantitative information about ionic-charge distributions only at sweep rates less than, typically, a few tenths of a volt per second.

SUMMARY OF THE INVENTION

We have discovered that when the applied field is varied in discrete increments, the incremental charge that is displaced in response to each voltage increment can be measured directly. We have further discovered that because an absolute measurement is obtained of each charge increment, it is not necessary to rely upon quasi-static equilibrium in order to interpret the characteristic curve quantitatively. As a consequence, it is possible, by varying the voltage incrementally, to complete at least some TVS sweeps in significantly less time than such sweeps would take if performed by the conventional method. Moreover, because the charge increments are measured directly, it is not necessary to refer to a calibration constant proportional to the sweep rate.

As a result, quantitative information can be read directly from the characteristic curve, even when the number of ions changes during the (incremental) voltage sweep.

Thus, we are here disclosing a method for fabricating a semiconductor device that includes the step of detecting impurities in the dielectric layer of an MOS capacitor structure on a wafer by heating the wafer, applying a voltage across the dielectric, varying the voltage in discrete increments, and monitoring the change in induced charge in response to each voltage increment.

The inventive method is here called "modified TVS." In connection with both TVS and modified TVS, the range over which the applied voltage is varied is here called the voltage sweep, even though in modified TVS the voltage is not swept continuously, but rather is varied in discrete increments.

DETAILED DESCRIPTION

Figure 4:
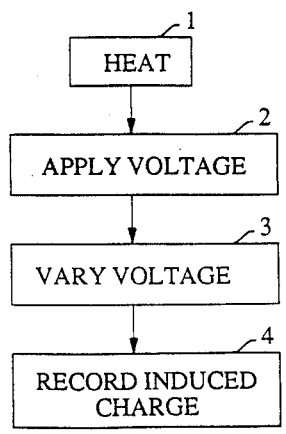
FIG. 4 is a flowchart of the steps included in one embodiment of the inventive method.

In a broad sense, the invention is a method of semiconductor device fabrication including the step of detecting impurities in a dielectric layer which is a part of the body of such device. With reference to FIG. 4, the detecting step comprises (1) heating the body to an elevated temperature, (2) applying a voltage across the dielectric layer, (3) varying the voltage in discrete increments, and (4) monitoring the change in induced charge in response to each voltage increment.

In addition, the dielectric layer is readily stressed at the endpoints of the voltage sweep by holding it for a predetermined period, for example about two minutes, at the positive or negative peak voltage. During this holding period, positive mobile charge in the dielectric accumulates at the interface having negative polarity. If, initially, the silicon/dielectric interface is the negative interface (i.e., the initial holding voltage is negative), then subseqently, somewhere in the middle of the sweep from the negative holding toward the positive holding voltage, the ions that have accumulated within the dielectric at the silicon/dielectric interface begin to move to the opposite interface. In many dielectrics, this motion is coherent and causes a peak to appear in the characteristics curve near zero applied volts, i.e., near where the applied voltage crosses over from negative to positive values. The peaks corresponding to coherent motion of sodium and similar ionic impurities are symmetric in that the peak that appears during the positive-going sweep has roughly the same area, and corresponds to roughly the same density of mobile charge, as the peak that appears during the negative-going sweep.

It should be noted in this regard that some ions, for example protons (hydrogen ions) become substantially trapped at the dielectric-metal interface, and as a consequence they fail to give rise to a peak during the negative-going half of the sweep cycle. It is further to be noted that in some dielectrics, the dissociation of protons from the silicon/dielectric interface and their subsequent motion through the dielectric may not be coherent. As a consequence, the TVS characteristic curve of these materials may not exhibit a well-defined peak, even in the positive-going half of the sweep cycle. However, other features of the characteristic curve, such as the presence of slope, are useful for assessing the contamination of the dielectric in these cases.

As a pedagogical aid to a more complete understanding of the invention, a particular embodiment is described below. The MOS capacitor is first heated to an elevated temperature of at least about 100° C., but not more than about 400° C., and typically about 300° C. During the entire process, the elevated temperature of the capacitor is held constant.

If the MOS capacitor is to be stressed, then prior to the voltage sweep it is subjected to a negative holding voltage greater than, or, preferably, equal to, the peak sweep voltage. Typically, a symmetric sweep is used, and the holding voltage typically equals the peak sweep voltage. For the purpose of detecting, e.g., alkali-metal-ion contamination, the peak voltages are chosen to subject the dielectric to an average electric field of at least 1 MV/cm, but to avoid dielectric breakdown, such fields should not exceed about 3 MV/cm.

For the purpose of detecting water, local fields must be produced within the dielectric that are capable of decomposing water to release protons, and for this purpose the peak voltages are chosen to subject the dielectic to an average electric field of at least about 1 MV/cm.

Figure 1:
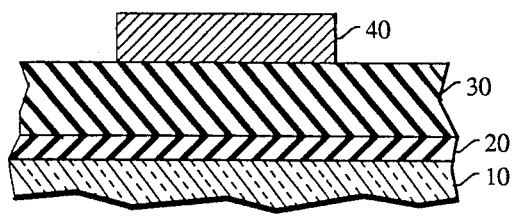
FIG. 1 is a schematic cross-sectional view of an exemplary sample prepared for application of the inventive method.

A typical sample has a composite dielectric structure as depicted, for example, in FIG. 1. Such a structure comprises, for example, an epitaxial-p/p+-silicon-substrate 10, a layer 20 of thermally-grown silicon dioxide 500 Å in thickness thermally grown on the substrate, and a 2000-Å-thick layer 30 of the dielectric to be tested grown on layer 20. Thus, the total dielectic thickness in a typical sample is about 2500 Å, and the corresponding holding voltage is typically about 40 V. (As noted, the corresponding average electric field in the dielectric should lie in the range from about 1 MV/cm.) On the upper surface of layer 30 is deposited a metal, typically aluminum, electrode layer 40.

The capacitor is maintained at the holding voltage for a selected holding period long enough for substantial mobile positive charge in the dielectric to accumulate at the silicon/dielectic interface. This period is typically about two minutes.

The voltage sweep is then applied by increasing the voltage in discrete increments of, e.g., about one volt until it reaches the holding voltage of the opposite sign. The charge appearing in the system due to each voltage increment is recorded directly. A practical range for the voltage increments is 0.1–5 volts.

The voltage is maintained at a selected aging time after each increment. The aging time should be sufficient for the equilibration of the mobile charge and the measuring system. However, mobile changes such as sodium ions usually equilibrate within a few tenths of a second. As a consequence, the response time of the measuring instruments, which is typically about 0.3 seconds, is a sufficient aging time. Longer aging times, for example aging times of about two seconds, are also readily used. Thus, a practical range for the aging times is 0.1–10 seconds.

Unlike conventional TVS, the mobile charges in modified TVS are not required to be near equilibrium at all times during the voltage sweep. Moreover, the equilibration time of the mobile ions following a voltage increment is not, in general, proportional to the size of the voltage increment. Instead, it typically has a dependence that is weaker than a linear dependence on the size of the voltage increment. For these reasons, a modified TVS voltage sweep cycle can generally be completed in less time than the corresponding conventional TVS cycle.

As noted above, the displacement charge appearing in the system as a result of each voltage increment is measured and recorded. When the voltage reaches the peak voltage of the opposite sign, the capacitor is again readily stressed as to accumulate the mobile charge at the aluminum/dielectic interface. The voltage is then incremented in the opposite direction, so that at the end of the cycle the applied voltage returns to its original value.

EXAMPLE

Preparation of plasma-oxide samples

Four-inch-diameter, epitaxial-(p/p$^+$)-<100<-silicon wafers were cleaned. A 500-Å-oxide layer was grown on the silicon surface at 100° C. in HCl and oxygen. On this thermally-grown oxide layer, a plasma-oxide layer 3500 Å thick was deposited at 200° C. using silane chemistry. This material was contaminated with sodium during deposition. On the upper (i.e., facing away from the substrate) surface of the plasma-oxide layer, a metal electrode was formed. The metal electrode was formed by sputter depositing a 1-micron-thick aluminum layer and patterning it into dots, each $2.4 \times 10^{-2}$ cm$^2$ in area. Just prior to the modified TVS measurement, the sample was annealed in hydrogen at 450° C.

Preparation of thermal-silicon-dioxide samples.

Four-inch-diameter, epitaxial-(p/p$^+$)-21 100>-silicon wafers were cleaned. On the silicon substrate, a 1000-Å-thick layer of thermal silicon dioxide was wet grown. This material was contaminated with a small amount of sodium during growth. On the upper surface of the thermal-oxide layer, a metal electrode was formed, as above, by sputter depositing a 1-micron-thick aluminum later and patterning it into dots, each $2.4 \times 10^{-2}$ cm$^2$ in area. Just prior to the modified TVS measurement, the sample was annealed in hydrogen at 450° C.

Electrical measurements

The dielectrics were characterized using a digital system that approximated a triangular-ramp voltage with a stepping-ramp voltage. A commercially available (Keithley Model 617) programmable electrometer was connected in the coulomb mode in conjunction with a built-in programmable voltage source. The electrometer and the voltage source were controlled by a commercially available (Hewlett-Packard Model 9836) desktop computer by means of an IEEE-488 bus interface. The voltage source was connected to the chuck that held the wafer. The device wafer was maintained at a constant elevated temperature of 300° C. with a temperature-controlled chuck manufactured by Temptronic, Inc., under the tradename Thermochuck Model TP36 System.

At the beginning of the positive-going sweep, and again at the beginning of the negative-going sweep, the samples were held at the positive or negative holding voltage for two minutes. The holding voltage in both cases was equal to the peak amplitude of the voltage sweep. In the case of the plasma-oxide sample, this amplitude was 50 V. In the case of the thermal-oxide sample, the amplitude was 10 V. In all cases, the aging time between voltage increments was two seconds.

Results

Figure 2:
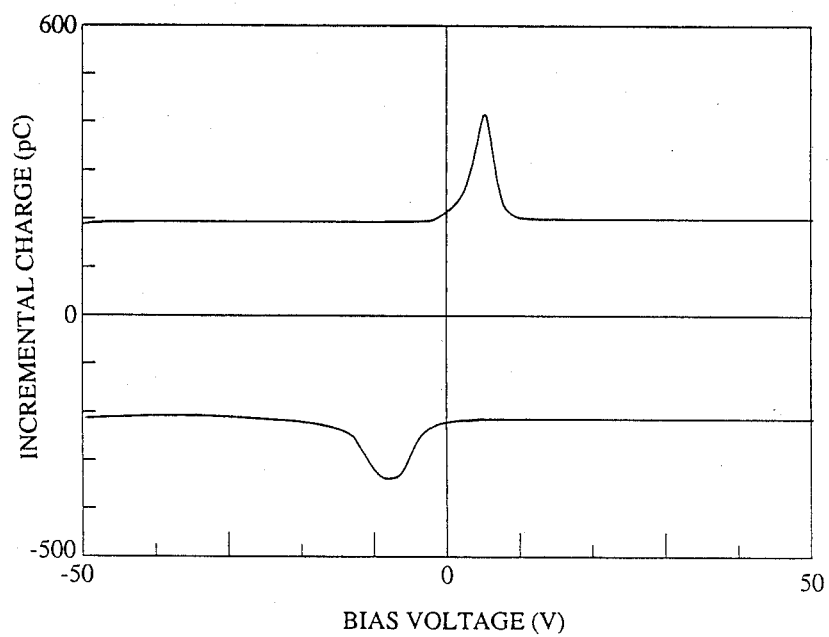
FIG. 2 is an exemplary modified TVS trace, made according to the inventive method, characterizing an exemplary plasma-oxide sample.
Figure 3:
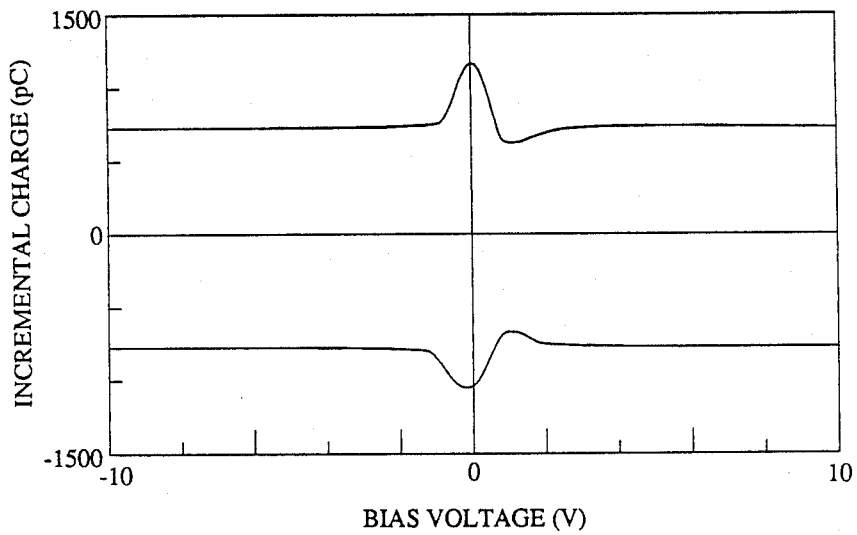
FIG. 3 is an exemplary modified TVS trace, made according to the inventive method, characterizing an exemplary thermal-oxide sample.

The modified TVS trace of the plasma-oxide sample is shown in FIG. 2. The modified TVS trace of the thermal-oxide sample is shown in FIG. 3.

We claim:

1. A method of semiconductor device fabrication including the step of detecting an impurity in a dielectric layer which is a part of the body such device, wherein the detecting step comprises:
   heating the body to an elevated temperature;
   applying a voltage across the dielectric layer;
   and varying the voltage between a maximum negative amplitude and a maximum positive amplitude; characterized in that
   the varying step comprises changing the voltage in discrete increments separated by time intervals, whereby a charge is induced by ionic impurity motion during each time interval; and
   the method further comprises the step of recording the induced charges.

2. The method of claim 1, wherein the maximum negative amplitude and the maximum positive amplitude are each adapted to create in the dielectric a volume-averaged electric field of at least about 1 MV/cm, but not more than about 3 MV/cm.

3. The method of claim 1, wherein the elevated temperature is at least about 100° C., but not more than about 400° C.

4. The method of claim 1, wherein the varying step comprises:
   increasing the voltage from the maximum negative amplitude to the maximum positive amplitude; and
   decreasing the voltage from the maximum positive amplitude to the maximum negative amplitude.

5. The method of claim 4, further comprising:
   before the increasing step, the step of stressing the dielectric layer at a negative voltage, and
   before the decreasing step, the step of stressing the dielectric layer at a positive voltage.

6. The method of claim 1, wherein the time intervals are at least about 0.1 second, but not more than about 10 seconds.

7. The method of claim 1, wherein the discrete voltage increments are at least 0.1 V., but not more than 5 V.

* * * * *